(12) United States Patent
Kang

(10) Patent No.: US 6,954,370 B2
(45) Date of Patent: Oct. 11, 2005

(54) NONVOLATILE FERROELECTRIC MEMORY DEVICE

(75) Inventor: Hee Bok Kang, Daejeon (KR)

(73) Assignee: Hynix Semiconductor Inc., Gyeonggi-do (KR)

(*) Notice: Subject to any disclaimer, the term of this patent is extended or adjusted under 35 U.S.C. 154(b) by 0 days.

(21) Appl. No.: 10/734,140

(22) Filed: Dec. 15, 2003

(65) Prior Publication Data
US 2004/0184305 A1 Sep. 23, 2004

(30) Foreign Application Priority Data
Mar. 19, 2003 (KR) .................... 10-2003-0017105

(51) Int. Cl.[7] ............................................. G11C 11/22
(52) U.S. Cl. ............................. 365/145; 365/189.04
(58) Field of Search ..................... 365/145, 189.04, 365/189.05, 198.11, 196

(56) References Cited

U.S. PATENT DOCUMENTS

| | | | | |
|---|---|---|---|---|
| 5,406,510 A | * | 4/1995 | Mihara et al. | ............ 365/145 |
| 6,201,731 B1 | * | 3/2001 | Kamp et al. | ............ 365/185.02 |
| 6,272,594 B1 | | 8/2001 | Gupta et al. | |
| 6,363,439 B1 | | 3/2002 | Battles et al. | |
| 6,721,198 B2 | * | 4/2004 | Kang | ............ 365/145 |

FOREIGN PATENT DOCUMENTS

KR 1019990049972 6/2001

* cited by examiner

Primary Examiner—Thong Q. Le
(74) Attorney, Agent, or Firm—Heller Ehrman LLP

(57) ABSTRACT

A nonvolatile ferroelectric memory device stores nonvolatile data in a ferroelectric capacitor and accesses cell data stored in a latch circuit of a sense amplifier in a read operation irrespective of a ferroelectric capacitor. Therefore, the nonvolatile ferroelectric memory cell overcomes the limit of the number of repeated writing operation due to the destroying operation of ferroelectric, and directly access data stored in a latch circuit to access data rapidly. As a result, the present invention obtains a high-speed nonvolatile FeRAM having a high reliability.

24 Claims, 14 Drawing Sheets

NONVOLATILE FERROELECTRIC MEMORY DEVICE

BACKGROUND OF THE INVENTION

1. Field of the Invention

The present invention relates to a nonvolatile ferroelectric memory device, and more specifically, to a nonvolatile ferroelectric memory device which can access data rapidly in a read operation.

2. Description of the Prior Art

Generally, a ferroelectric random access memory (FeRAM) has the data processing speed as rapidly as a Dynamic Random Access Memory (DRAM), and also retain data even in a power-off state. For this reason, the nonvolatile ferroelectric memory has attracted considerable attention as a next generation memory device.

The FeRAM has a structure similar to the DRAM, and employs ferroelectric as a material for a capacitor to use a high residual polarization characteristic of the FeRAM. The residual polarization characteristic protects data from erasing even when electric field is removed.

Technical features of FeRAM discussed above are disclosed in Korea Patent Application No. 1999-49972 by the inventor of the present invention. Therefore, the configuration of FeRAM and its operation are not described herein.

This conventional nonvolatile ferroelectric memory device stores nonvolatile data in a ferroelectric capacitor, and repeatedly destroys and restores the data stored in the ferroelectric capacitor in a read/write operation of data and in a power-up mode.

Accordingly, the conventional nonvolatile ferroelectric memory device cannot access data rapidly in a read operation due to the repeated destroying and restoring operations. Furthermore, since it cannot overcome the limit of the number of repeated writing operations due to the destroying operation of the ferroelectric capacitor, it falls in reliability and thereby a high-speed nonvolatile ferroelectric memory device cannot be obtained.

SUMMARY OF THE INVENTION

Accordingly, it is an object of the present invention to prevent data fail of read data by precharging read bit lines in a read operation mode.

It is another object of the present invention to rapidly access cell data stored in a latch unit of a sense amplifier in a read operation mode.

It is still another object of the present invention to overcome the limit of the number of repeated writing due to the destroying operation of ferroelectric by restoring data stored in a memory cell in a power-up mode in response to a special program command.

To achieve the above objects, a nonvolatile ferroelectric memory device comprises a memory control block for outputting control signals in response to a write enable command signal, a read enable command signal and a reset signal, wherein the control signals control data read/write operations; a ferroelectric memory cell array for writing the data and reading data stored in a sense amplifier in response to the control signals; and a power-up reset circuit for outputting the reset signal to restore data stored in the ferroelectric memory cell array.

DETAILED DESCRIPTION OF PREFERRED EMBODIMENTS

The present invention will be described in detail with reference to the accompanying drawings.

Figure 1:
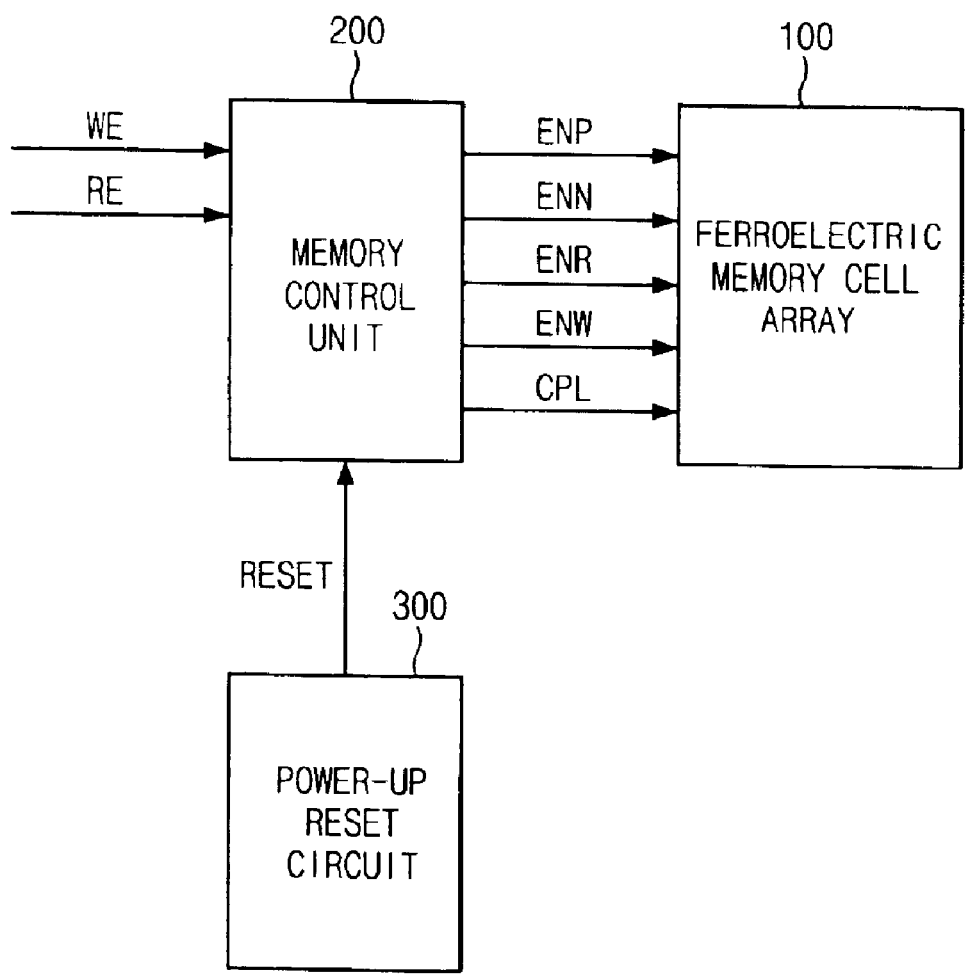
FIG. 1 is a block diagram illustrating a nonvolatile ferroelectric memory device according to the present invention.

FIG. 1 is a block diagram illustrating a nonvolatile ferroelectric memory device according to the present invention.

As illustrated in FIG. 1, a nonvolatile ferroelectric memory device comprises a ferroelectric memory cell array 100, a memory control unit 200 and a power-up reset circuit 300.

In this embodiment, the ferroelectric memory cell array 100 reads/writes data in response to a pull-up enable signal ENP, a pull-down enable signal ENN, a read enable signal ENR, a write enable signal ENW and a cell plate signal CPL.

The memory control unit 200 outputs a pull-up enable signal ENP, a pull-down enable signal ENN, a read enable signal ENR, a write enable signal ENW and a cell plate signal CPL in response to a write enable command signal WE and a read enable command signal RE.

The power-up reset circuit 300 generates a reset signal RESET for initializing the memory control unit 200 in a power-up mode.

This configuration of the present invention can restore data stored in a memory cell in a power-up mode in response to a reset signal RESET. Furthermore, in order to program new data in a memory cell, the present invention changes cell data in response to a write enable command signal WE and a read enable command signal RE.

Figure 2:
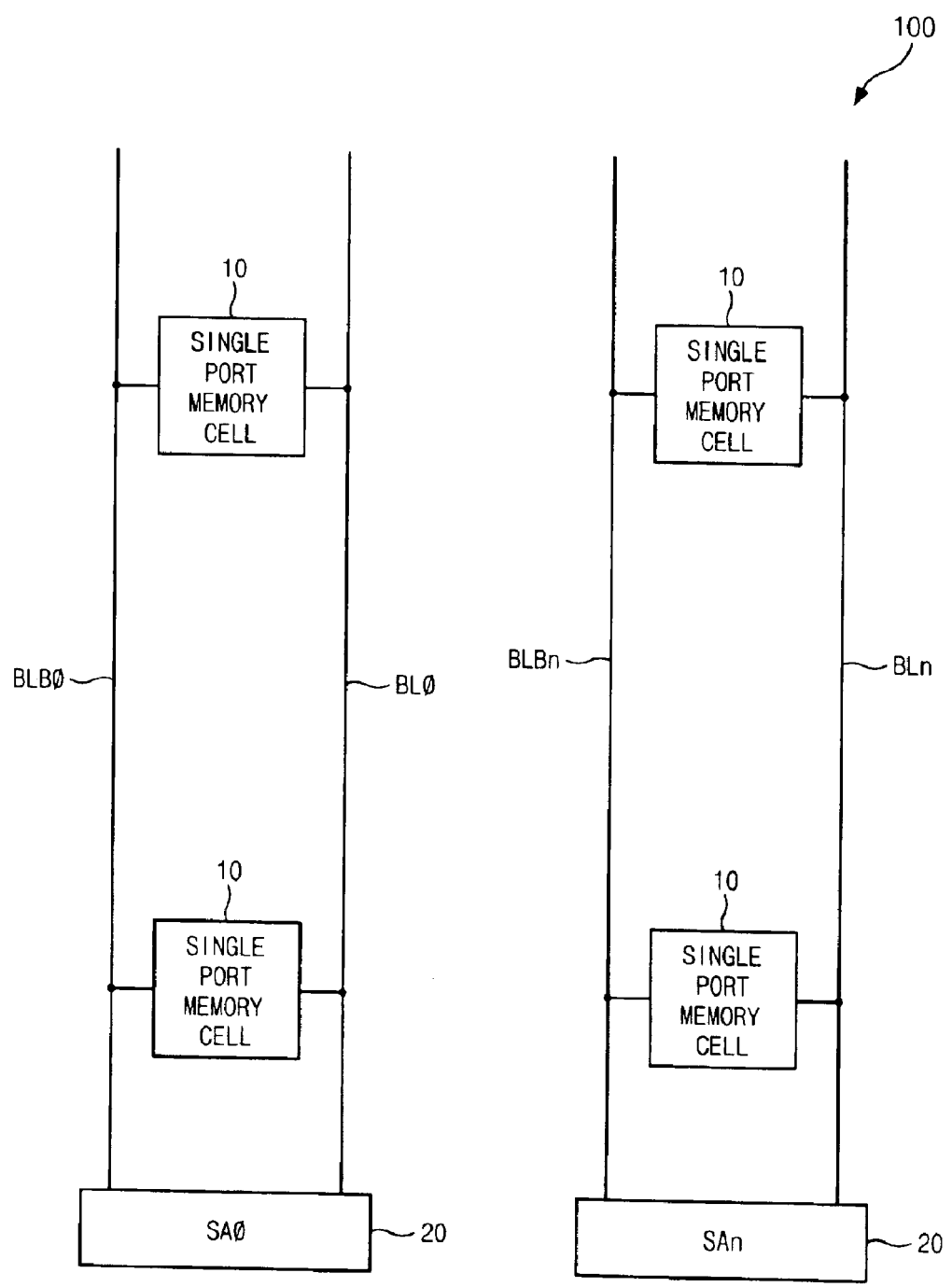
FIG. 2 is a block diagram illustrating a first example of the ferroelectric memory cell array of FIG. 1.

FIG. 2 is a block diagram illustrating a first example of the ferroelectric memory cell array 100 of FIG. 1.

As shown in FIG. 2, a ferroelectric memory cell array 100 includes a plurality of bitline pairs BL0–BLn and BLB0–BLBn, and a plurality of single port memory cells 10 arranged in column direction between a pair of bitlines BL and BLB. A pair of bitlines BL and BLB shares a sense amplifier 20.

A plurality of the single port memory cells 10 share a write enable signal ENW, a cell plate signal CPL, a pull-down enable signal ENN and a pull-up enable signal ENP.

Figure 3:
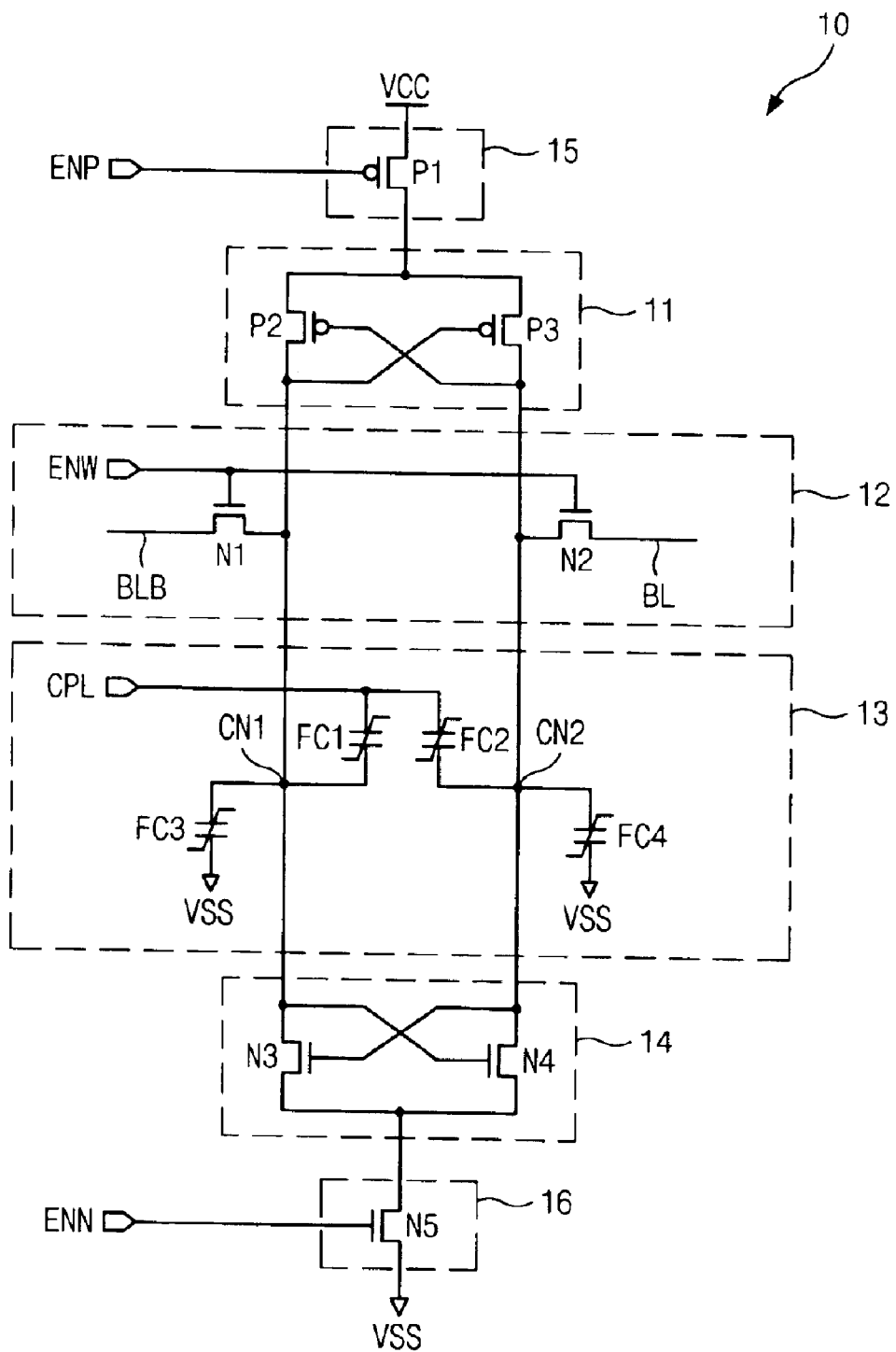
FIG. 3 is a circuit diagram illustrating a single port memory cell of FIG. 2.

FIG. 3 is a circuit diagram illustrating the single port memory cell 10 of FIG. 2.

FIG. 3 shows a nonvolatile memory cell comprising bitlines BL and BLB which constitute each one port to input/output read/write data.

The single port memory cell 10 comprises a PMOS latch unit 11, a write control unit 12, a ferroelectric capacitor unit 13, a NMOS latch unit 14, a pull-up switch 15 and a pull-down switch 16.

The PMOS latch unit 11 is disposed between the pull-up switch 15 and a write control unit 12, and includes cross-coupled PMOS transistors P2 and P3 between output nodes CN1 and CN2. The write control unit 12 includes NMOS transistors N1 and N2 which selectively connect a pair of bitlines BL and BLB with output nodes CN1 and CN2 in response to a write enable signal ENW.

The ferroelectric capacitor unit 13 comprises first and second ferroelectric capacitors FC1 and FC2 with one terminal connected to output node CN1 and CN2, respectively and the other terminal commonly receiving a cell plate signal CPL. The ferroelectric capacitor unit 13 also comprises third and fourth ferroelectric capacitors FC3 and FC4 with one terminal connected to output nodes CN1 and CN2, respectively and the other terminal connected to ground voltages. The third and fourth ferroelectric capacitors FC3 and FC4 are selectively employed depending on the loading level control of output nodes CN1, CN2.

The NMOS latch unit 14 is disposed between the ferroelectric capacitor unit 13 and the pull-down switch 16, and includes cross-coupled NMOS transistors N3 and N4 between output nodes CN1 and CN2.

Furthermore, the pull-up switch 15 is disposed between a power supply voltage VCC and the PMOS latch unit 11, and includes a PMOS transistor P1 receiving a pull-up enable signal ENP through a gate electrode. The pull-down switch 16 is disposed between the NMOS latch unit 14 and a ground voltage VSS, and includes a NMOS transistor N5 receiving a pull-down enable signal ENN through a gate terminal.

As shown above, the single port memory cell 10 comprises the PMOS latch unit 11 having two transistors, the write control unit 12 having two transistors, and the NMOS latch unit 14 having two transistors, and further comprises four ferroelectric capacitors FC1~FC4 for storing nonvolatile data and controlling the sensing load. Accordingly, the single port memory cell 10 has 8T(Tansistor)4C(Capacitor) structure, comprising eight transistors and four capacitors.

Figure 4:
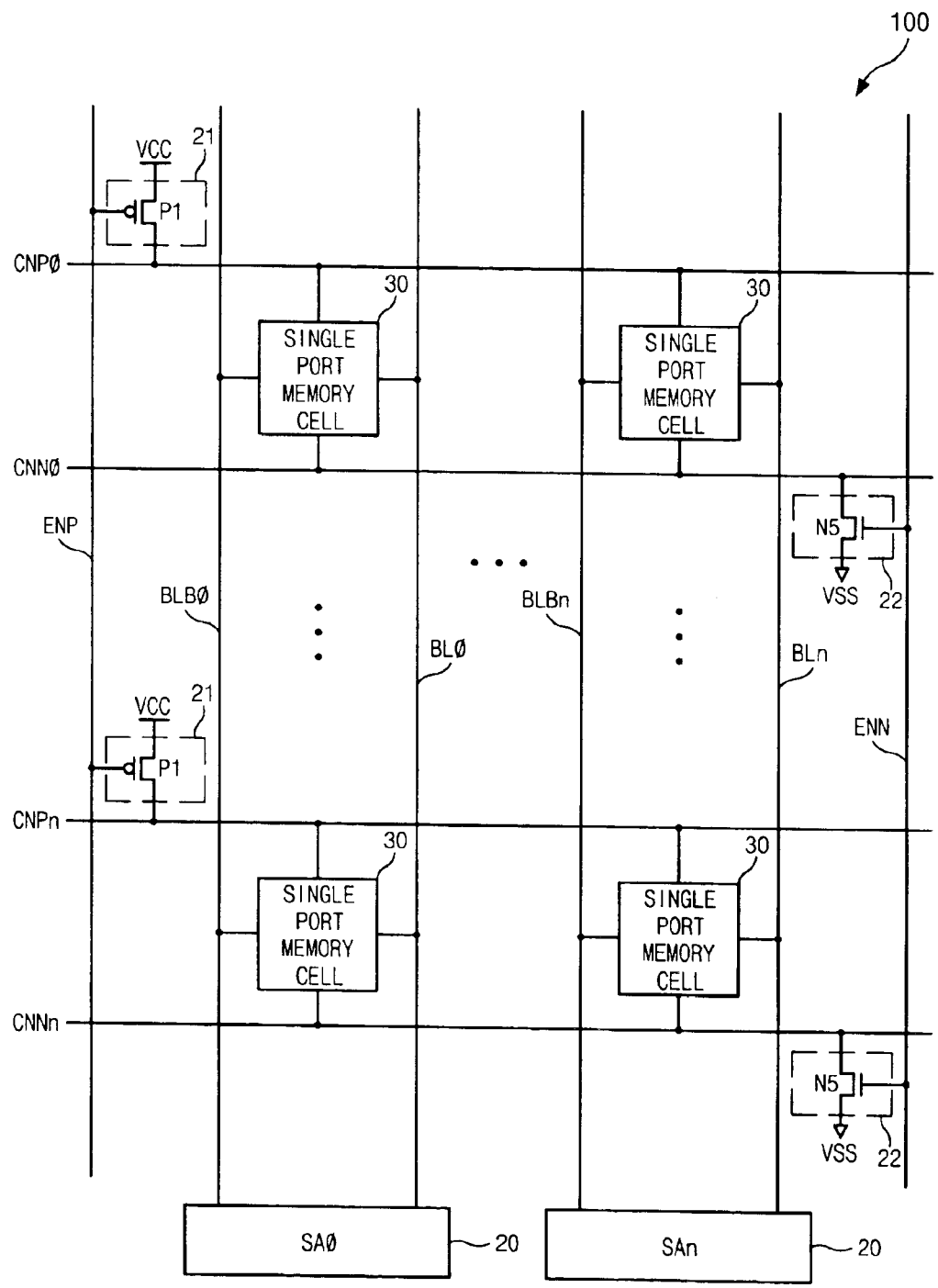
FIG. 4 is a block diagram illustrating a second example of the ferroelectric memory cell array of FIG. 1.

FIG. 4 is a block diagram illustrating a second example of the ferroelectric memory cell array 100 of FIG. 1.

As shown in FIG. 4, the ferroelectric memory cell array 100 comprises a plurality of bitline pairs BL0–BLn and BLB0–BLBn, a plurality of common pull-up lines CNP0–CNPn, and a plurality of common pull-down lines CNN0–CNNn, and further comprises a plurality of single port memory cells 30 arranged in column direction between a pair of bitlines BL and BLB. A pair of bitlines BL and BLB shares a sense amplifier 20.

A pull-up switch 21 is connected between a power supply voltage VCC and a pull-up line CNP, and a pull-down switch 22 is connected between a ground voltage VSS and a common pull-down line CNN.

In this embodiment, a write enable signal ENW and a cell plate signal CPL are shared in row direction by a plurality of single port memory cells 30. A pull-down enable signal ENN and a pull-up enable signal ENP are shared in column direction by a plurality of pull-up switches 21 and a plurality of pull-down switches 22, respectively.

The single port memory cells 30 connected in one row direction independently share one pull-up switch 21 and one pull-down switch 22. Accordingly, a load voltage applied to the single port memory cells 30 connected in one row direction is prevented from being outputted to single port memory cells connected in the other row direction.

Figure 5:
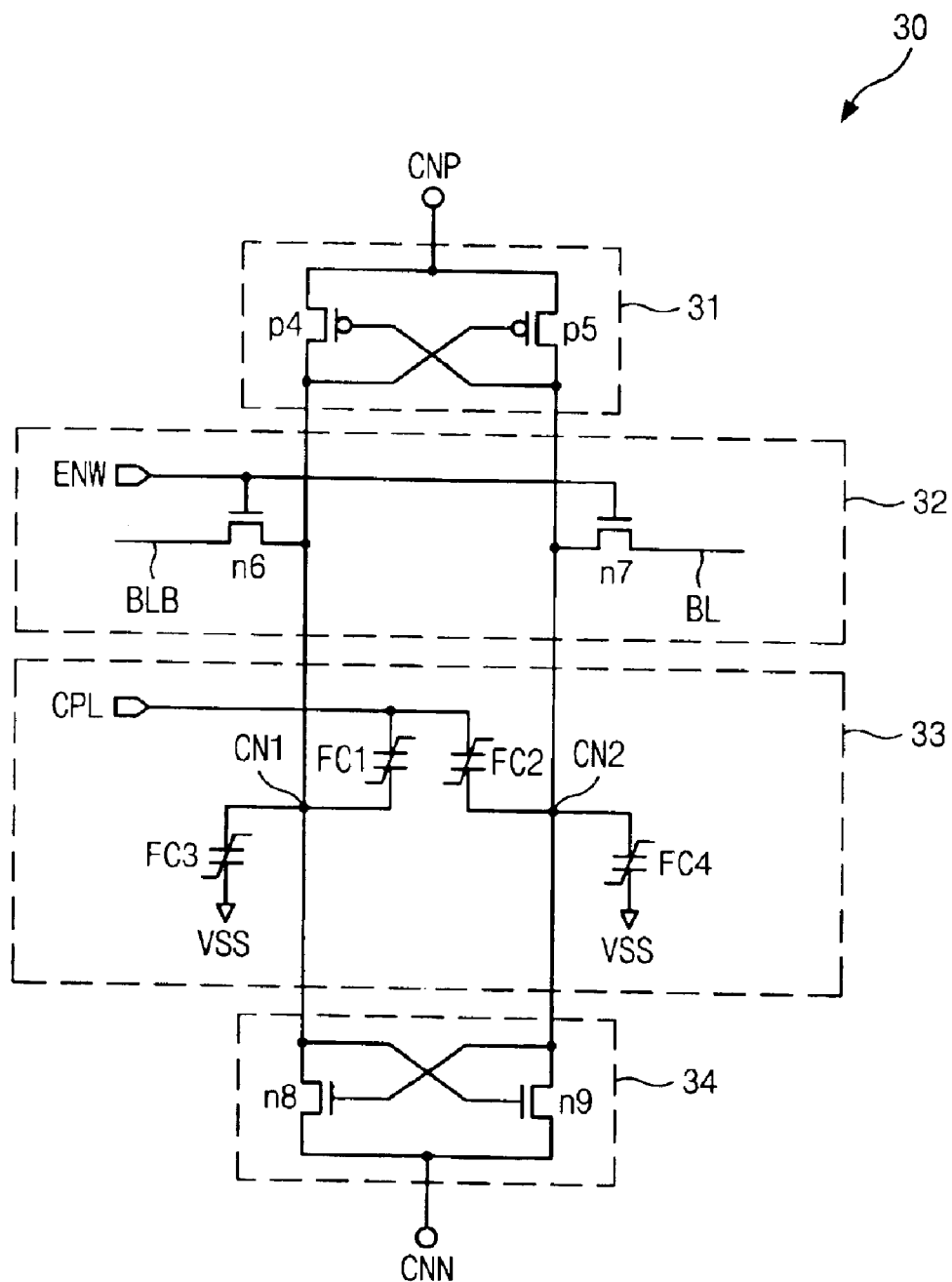
FIG. 5 is a circuit diagram illustrating a single port memory cell of FIG. 4.

FIG. 5 is a circuit diagram illustrating the single port memory cell of FIG. 4.

As shown in FIG. 5, the single port memory cell 30 comprises a PMOS latch unit 31, a write control unit 32, a ferroelectric capacitor unit 33 and a NMOS latch unit 34.

The PMOS latch unit 31 is disposed between a common pull-up line CNP and a write control unit 32, and includes cross-coupled PMOS transistors P4 and P5 between output nodes CN1 and CN2.

The write control unit 32 comprises NMOS transistors N6 and N7 for selectively connecting a pair of bitlines BL and BLB with output nodes CN1 and CN2, respectively in response to a write enable signal ENW.

The ferroelectric capacitor unit 33 comprises first and second ferroelectric capacitors FC1 and FC2 with one terminal connected to output nodes CN1 and CN2, respectively and the other terminal commonly receiving a cell plate signal CPL, and third and fourth ferroelectric capacitors FC3 and FC4 with one terminal connected to output nodes CN1 and CN2, respectively and the other terminal connected to ground voltages. The third and fourth ferroelectric capacitors FC3, FC4 are selectively employed depending on the loading level control of output nodes CN1, CN2.

The NMOS latch unit 34 is disposed between the ferroelectric capacitor unit 33 and a common pull-down line CNN, and includes cross-coupled NMOS transistors N8 and N9 between output nodes CN1 and CN2.

Figure 6:
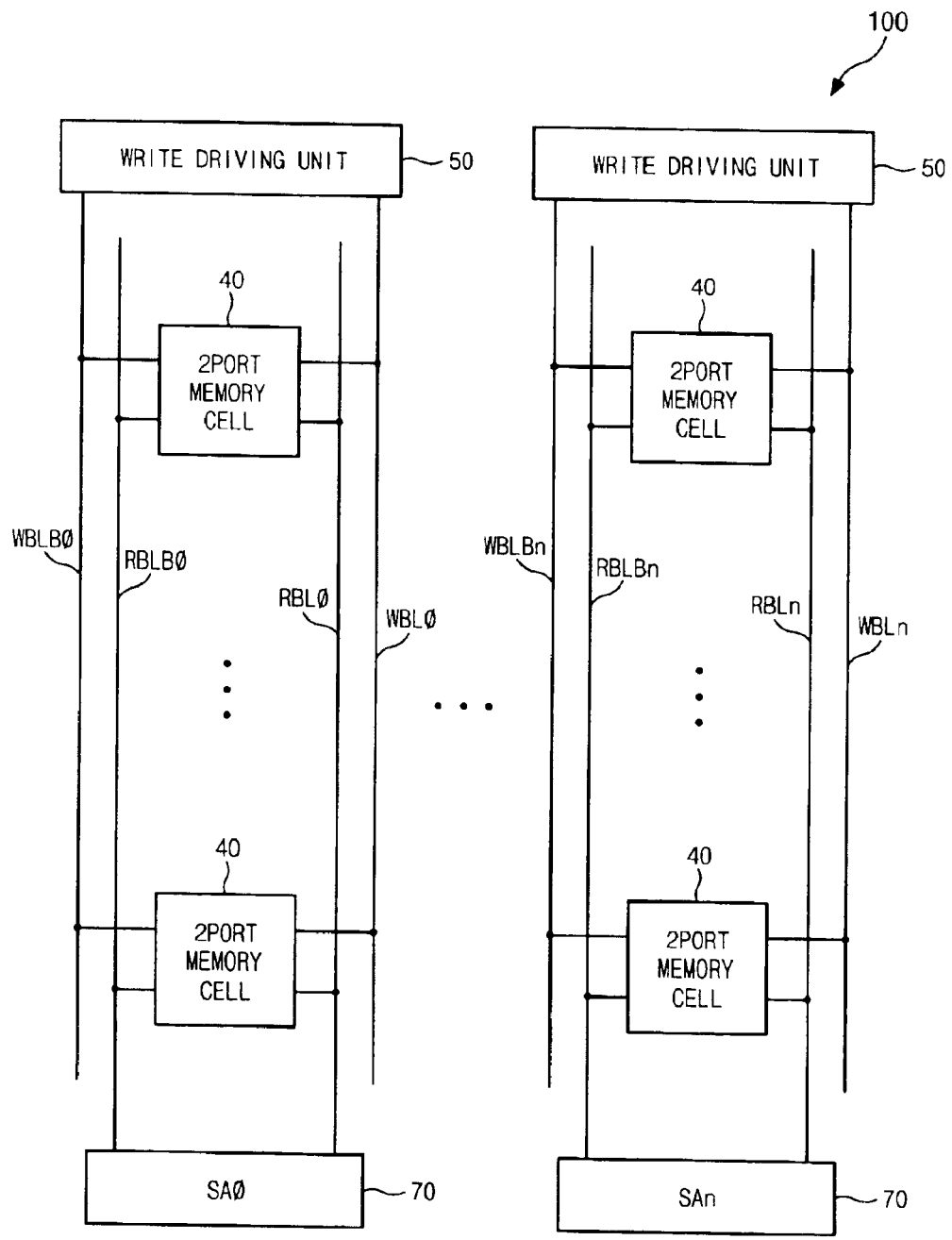
FIG. 6 is a block diagram illustrating a third example of the ferroelectric memory cell array of FIG. 1.

FIG. 6 is a block diagram illustrating a third example of the ferroelectric memory cell array 100 of FIG. 1.

As shown in FIG. 6, the ferroelectric memory cell array 100 comprises a plurality of write bitline pairs WBL0–WBLn and WBLB0–WBLBn, a plurality of read bitline pairs RBL0–RBLn and RBLB0–RBLBn, and a plurality of 2 port memory cells 40 arranged in column direction between a pair of write bitlines WBL and WBLB and a pair of read bitlines RBL and RBLB. A pair of read bitlines RBL and RBLB shares a sense amplifier 70. A pair of write bitlines WBL and WBLB shares a write driving unit 50.

A write enable signal ENW, a read enable signal ENR, a cell plate signal CPL, a pull-down enable signal ENN and a pull-up enable signal ENP are shared in row direction by the plurality of 2 port memory cells 40.

Figure 7:
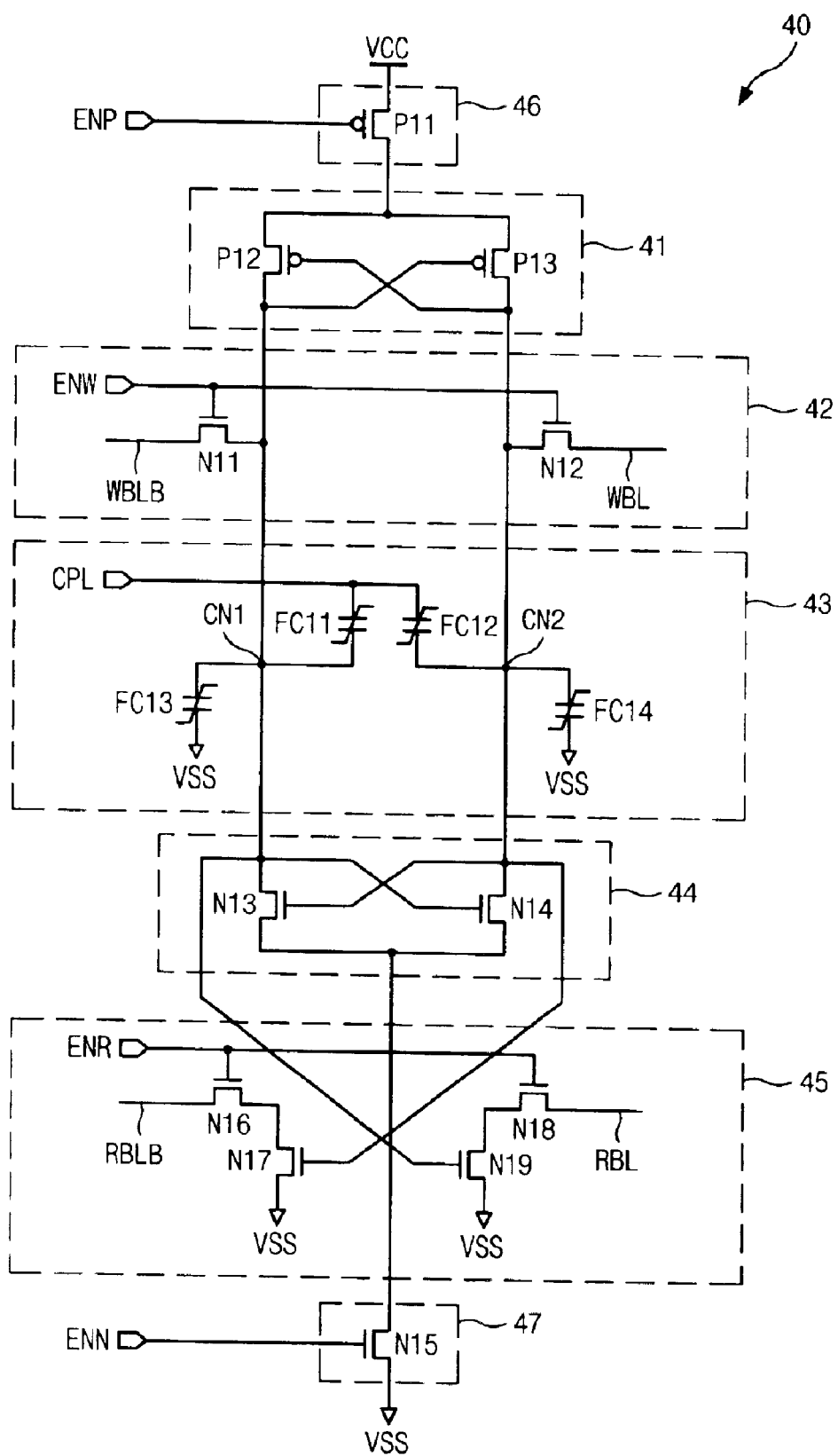
FIG. 7 is a circuit diagram illustrating a 2 port memory cell of FIG. 6.

FIG. 7 is a circuit diagram illustrating the 2 port memory cell 40 of FIG. 6.

FIG. 7 shows a ferroelectric memory cell which constitutes two input/output ports to receive write data from a pair of write bitlines WBL and WBLB and to output read data into a pair of read bitlines RBL and RBLB, respectively.

The 2 port memory cell 40 comprises a PMOS latch unit 41, a write control unit 42, a ferroelectric capacitor unit 43, a NMOS latch unit 44, a read control unit 45, a pull-up switch 46 and a pull-down switch 47.

The PMOS latch unit 41 is disposed between the pull-up switch 46 and the write control unit 42, and includes cross-coupled PMOS transistors P12 and P13 between output nodes CN1 and CN2. The write control unit 42 includes NMOS transistors N11 and N12 selectively connecting output nodes CN1 and CN2 with a pair of write bitlines WBL and WBLB in response to a write enable signal ENW.

The ferroelectric capacitor unit 43 comprises first and second ferroelectric capacitors FC11 and FC12 with one terminal connected to output nodes CN1 and CN2, respectively and the other terminal commonly receiving a cell plate signal CPL, and third and fourth ferroelectric capacitors FC13 and FC14 with one terminal connected to output nodes CN1 and CN2, respectively and the other terminal connected to a ground voltage. The third and fourth ferroelectric capacitors FC13, FC14 are selectively employed depending on the loading level control of output nodes CN1 and CN2.

The NMOS latch unit 44 comprises cross-coupled NMOS transistors N13 and N14 between output nodes CN1 and CN2.

The read control unit 45 comprises four NMOS transistors N16~N19. The NMOS transistors N16 and N17 receive a read enable signal ENR and a potential of an output node CN2 respectively through gate electrodes to selectively connect a read bitline RBLB to a ground voltage. The NMOS transistors N18 and N19 receive a read enable signal ENR and a potential of an output node CN1 respectively through gate electrodes to selectively connect a read bitline RBL to a ground voltage.

The pull-up switch 46 is connected between a power supply voltage VCC and the PMOS latch unit 41, and comprises a PMOS transistor P11 receiving a pull-up enable signal through a gate electrode. The pull-down switch 47 is connected between the NMOS latch unit 44 and a ground voltage VSS, and comprises a NMOS transistor N15 receiving a pull-down enable signal ENN through a gate electrode.

As shown above, the 2 port memory cell 40 has 12T (Transistor)4C(Capacitor) structure, comprising 12 transistors and 4 capacitors.

The 2 port memory cell 40 according to the present invention writes data through a pair of write bitlines WBL and WBLB in a write mode, and senses and reads the stored data through a pair of read bitlines RBL and RBLB in a read mode.

Figure 8:
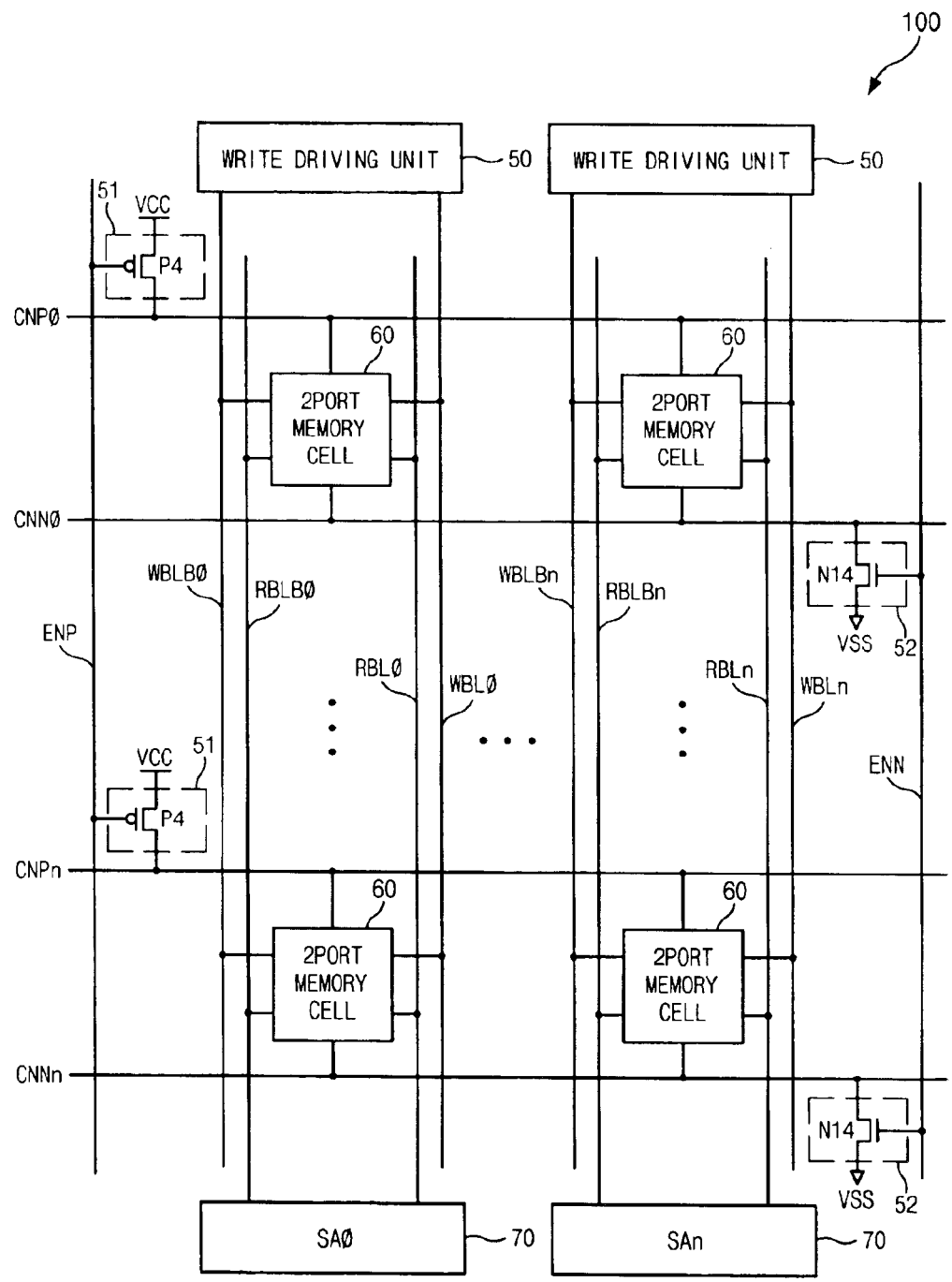
FIG. 8 is block diagram illustrating a fourth example of the ferroelectric memory cell array of FIG. 1.

FIG. 8 is a block diagram illustrating a fourth example of the ferroelectric memory device of FIG. 1.

The ferroelectric memory device 100 comprises a plurality of write bitline pairs WBL0–WBLn and WBLB0–WBLBn, a plurality of read bitline pairs RBL0–RBLBn, a plurality of common pull-up lines CNP0–CNPn and a plurality of common pull-down lines CNN0–CNNn, and a plurality of 2 port memory cells 60 arranged in column direction between a pair of write bitlines WBL and WBLB and a pair of read bitlines RBL and RBLB. A pair of read bitlines RBL and RBLB shares a sense amplifier 70, and a pair of write bitlines WBL and WBLB shares a write driving unit 50.

A pull-up switch 51 is connected between a power supply voltage VCC and a common pull-up line CNP, and a pull-down switch 52 is connected between a ground voltage VSS and a common pull-down line CNN.

A write enable signal ENW, a read enable signal ENR and a cell plate signal CPL are shared in row direction by the plurality of 2 port memory cells 60. A pull-down enable signal ENN and a pull-up enable signal ENP are shared in column direction by a plurality of pull-up switches 51 and a plurality of pull-down switches 52.

The plurality of 2 port memory cells 60 connected in one row direction independently share a pull-up switch 51 and a pull-down switch 52. Accordingly, a load voltage applied to 2 port memory cells 60 connected in one row direction is prevented from being outputted to the 2 port memory cells 60 connected in the other row direction.

Figure 9:
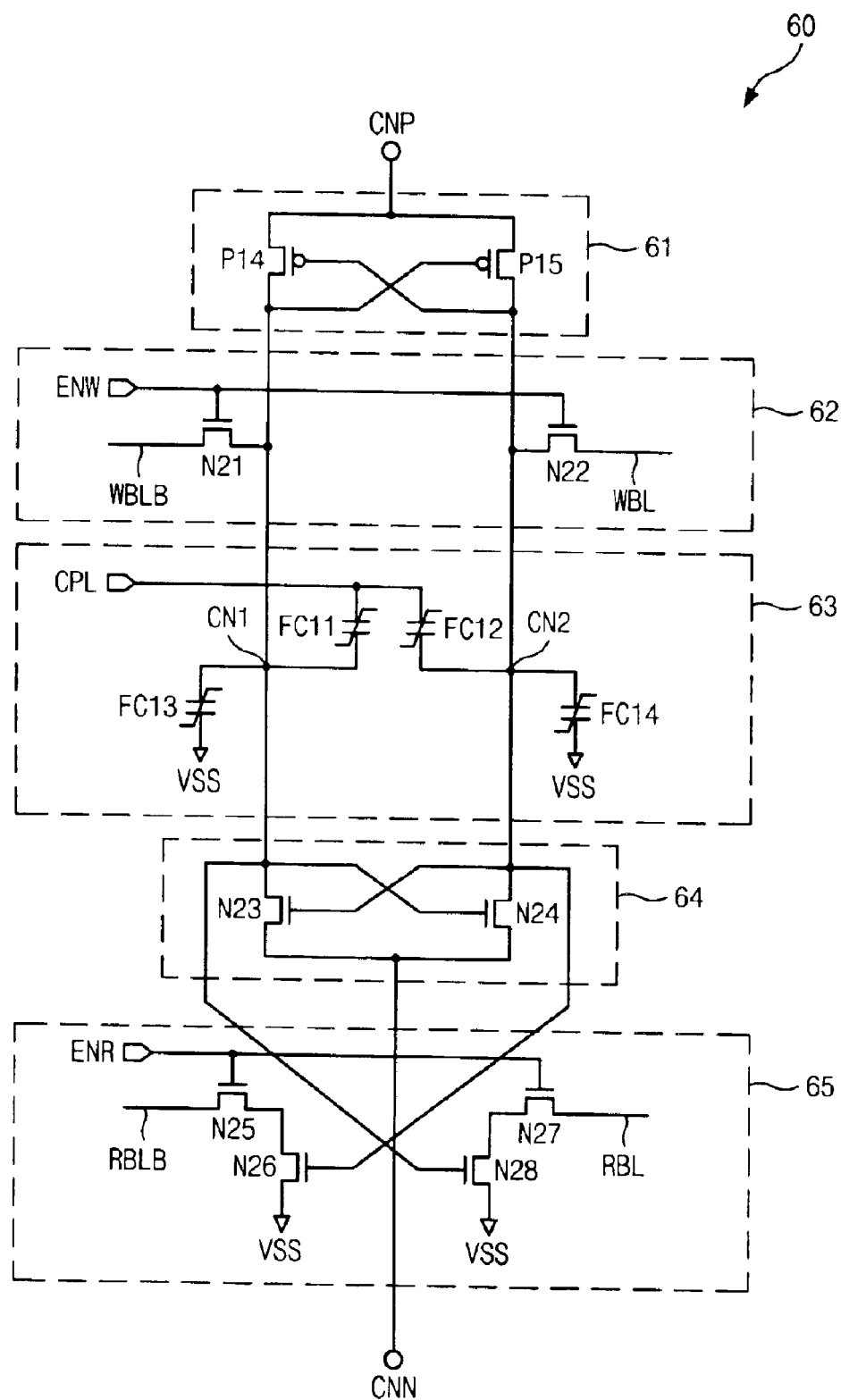
FIG. 9 is a circuit diagram illustrating a 2 port memory cell of FIG. 8.

FIG. 9 is a circuit diagram illustrating the 2 port memory cell 60 of FIG. 8.

FIG. 9 shows a ferroelectric memory cell which constitutes two input/output ports to receive write data from a pair of write bitlines WBL and WBLB and to output read data into a pair of read bitlines RBL and RBLB, respectively.

The 2 port memory cell 60 comprises a PMOS latch unit 61, a write control unit 62, a ferroelectric capacitor unit 63 and a NMOS latch unit 64.

The PMOS latch unit 61 is disposed between a common pull-up line CNP and a write control unit 62, and comprises cross-coupled PMOS transistors P14 and P15 between output nodes CN1 and CN2. The write control unit 62 comprises NMOS transistors N21 and N22 selectively connecting a pair of write bitlines WBL and WBLB to output nodes CN1 and CN2 in response to a write enable signal ENW.

The ferroelectric capacitor unit 63 comprises first and second ferroelectric capacitors FC11 and FC12 with one terminal connected to output nodes CN1 and CN2, respectively and the other terminal commonly receiving a cell plate signal CPL, and third and fourth ferroelectric capacitors FC13 and FC14 with one terminal connected to output nodes CN1 and CN2, respectively and the other terminal connected to a ground voltage. The third and fourth ferroelectric capacitors FC13 and FC14 are selectively employed depending on the loading level control of output nodes CN1 and CN2.

The NMOS latch unit 64 comprises cross-coupled NMOS transistors N23 and N24 between output nodes CN1 and CN2.

The read control unit 65 comprises four NMOS transistors N25~N28. The NMOS transistors N25 and N26 receive a read enable signal ENR and a potential of an output node CN2 through gate terminals, respectively to selectively connect a read bitline RBLB to a ground voltage. The NMOS transistors N27 and N28 receive a read enable signal ENR and a potential of an output node CN1 through gate terminals, respectively to selectively connect a read bitline RBL to a ground voltage.

As shown above, the 2 port memory cell 60 has 10T (Transistor)4C(Capacitor) structure, comprising ten transistors and four capacitors.

The 2 port memory cell 60 of the present invention writes data through a pair of write bitlines WBL and WBLB in a write mode, and senses and reads the stored data through a pair of read bitlines RBL and RBLB in a read mode.

Also, the multi-port memory cell comprises a plurality of write bitline pairs WBL and WBLB, a plurality of read bitline pairs RBL and RBLB, a plurality of write control units 62, and a plurality of read control units 65.

As shown above, the 2 port memory cells 30, 60 have bitlines of off-drain type, in which the current can flow in but it does not flow out in a read mode.

Accordingly, the 2 port memory cells 30, 60 can transit the voltage level of a pair of read bitlines RBL and RBLB from a high level to a low level, but they cannot transit it from a low level to a high level.

Figure 10:
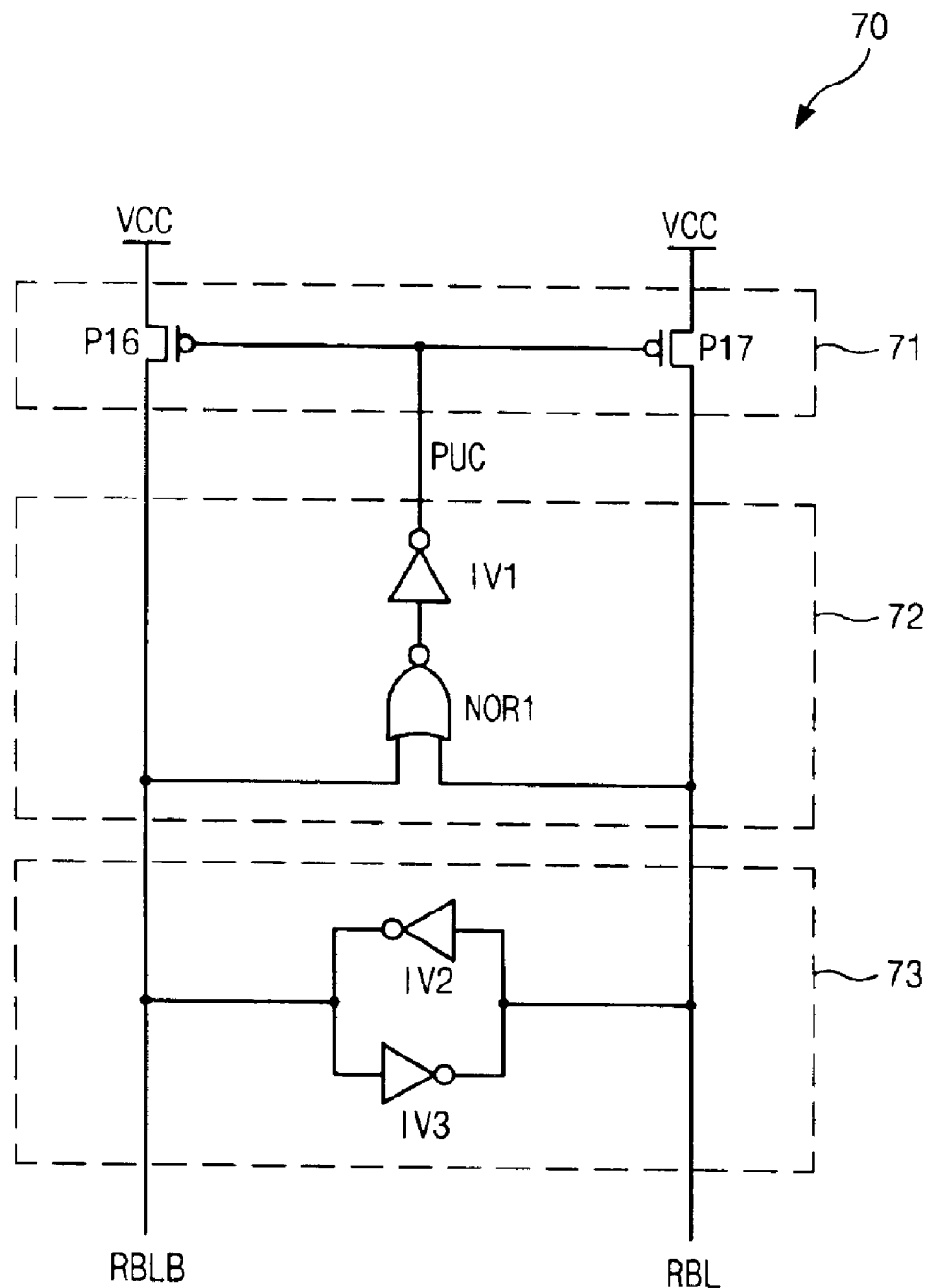
FIG. 10 is a circuit diagram illustrating a sense amplifier of the 2 port memory cell according to the present invention.

FIG. 10 is a circuit diagram illustrating a sense amplifier 70 of the 2 port memory cell array 100 according to the present invention.

The sense amplifier 70 comprises a pull-up driving unit 71, a pull-up control unit 72 and a latch unit 73.

The pull-up driving unit 71 is disposed between a power supply voltage VCC and the pull-up control unit 72, and includes PMOS transistors P16 and P17 receiving a pull-up control signal PUC through a common gate terminal.

The pull-up control unit 72 comprises a NOR gate NOR1 with two input terminals connected to a pair of read bitlines RBL and RBLB, and an inverter IV1 for inverting an output signal from the NOR gate NOR1 to output a pull-up control signal PUC.

The latch unit 73 comprises inverters IV2 and IV3 having a latch structure in which stores an output signal from a pair of read bitlines RBL and RBLB for a predetermined time.

When a pair of read bitlines RBL and RBLB goes to a low level in response to a pull-up control signal PUC, a pair of the read bitlines RBL and RBLB is precharged to a high level during this period.

Figure 11:
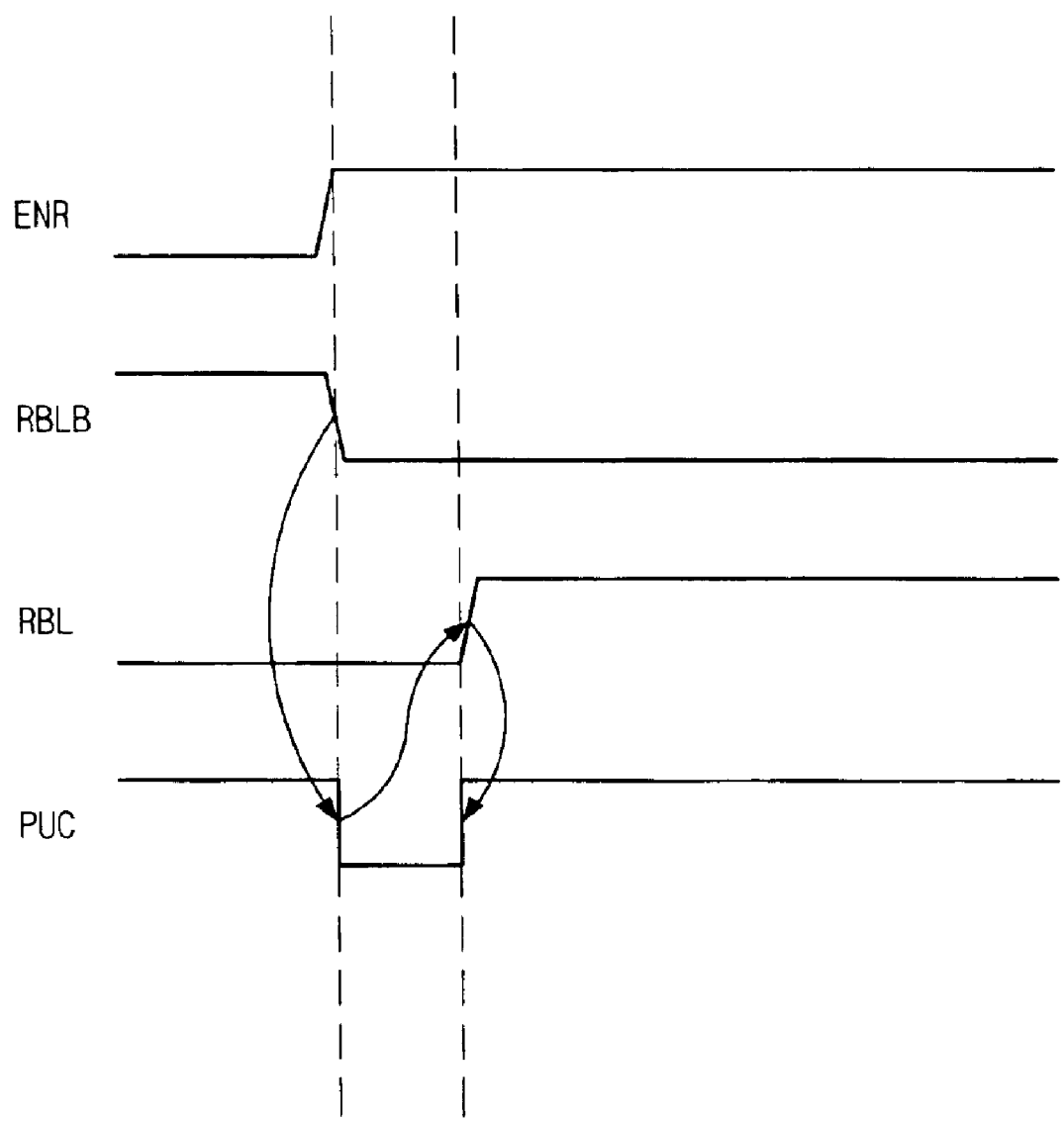
FIG. 11 is a timing diagram illustrating the operation of the sense amplifier of FIG. 10.

The operation of the sense amplifier 70 having this configuration is described as follows with reference to FIG. 11.

First, a read bitline RBLB goes to a low level when a read enable signal ENR of the read control unit 65 is enabled to a high level. At this time, a pair of read bitlines RBL and RBLB goes to a low level so that the NOR gate NOR1 outputs an output signal of a high level.

After that, a pull-up control signal PUC goes to a low level by the inverter IV1, and the PMOS transistors P16 and P17 of the pull-up control unit 71 are turned on in response to the pull-up control signal PUC. Accordingly, a pair of read bitlines RBL and RBLB is pulled up by a power supply voltage until a read bitline RBL goes to a high level.

Finally, when the read bitline RBL goes to a high level, a pull-up control signal PUC goes to a high level to cease the pull-up operation.

Figure 12:
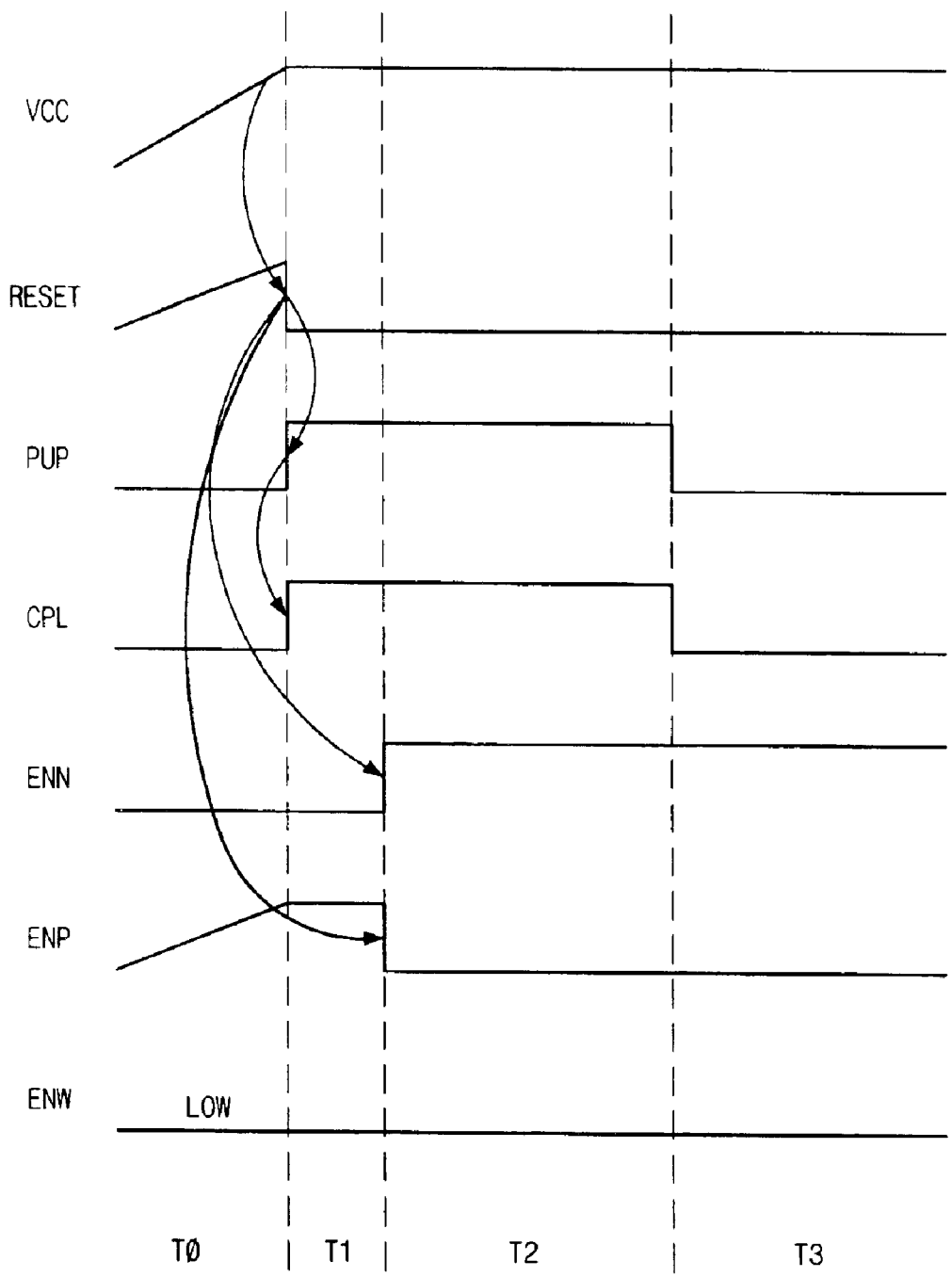
FIG. 12 is a timing diagram illustrating the operation of the nonvolatile ferroelectric memory device of FIG. 1 in a power-up mode.

FIG. 12 is a timing diagram illustrating the operation of the nonvolatile ferroelectric memory device of FIG. 1 in a power-up mode.

First, when a power supply reaches a stable power supply voltage VCC level in T1 period, a reset signal RESET goes to a low level and a power-up detecting signal PUP goes to a high level.

After that, a cell plate signal CPL goes to a high level in response to the power-up detecting signal PUP. At this time, the capacitance load among ferroelectric capacitors of a ferroelectric memory cell in the ferroelectric memory cell array 100 generates the voltage difference in both terminal nodes of cell.

In T2 period that the sufficient voltage difference is generated in both terminal nodes of cell, a pull-down enable signal ENN goes to a high level and a pull-up enable signal ENP goes to a low level to amplify data of both terminal nodes of cell.

After that, when amplifying data of both terminal nodes of cell is completed in T3 period, the power-up detecting signal PUP and the cell plate signal CPL go back to a low level. Accordingly, the destroyed high data of the ferroelectric capacitor is restored again. At this time, the write enable signal ENW maintains a low level to prevent external data from being written again.

Figure 13:
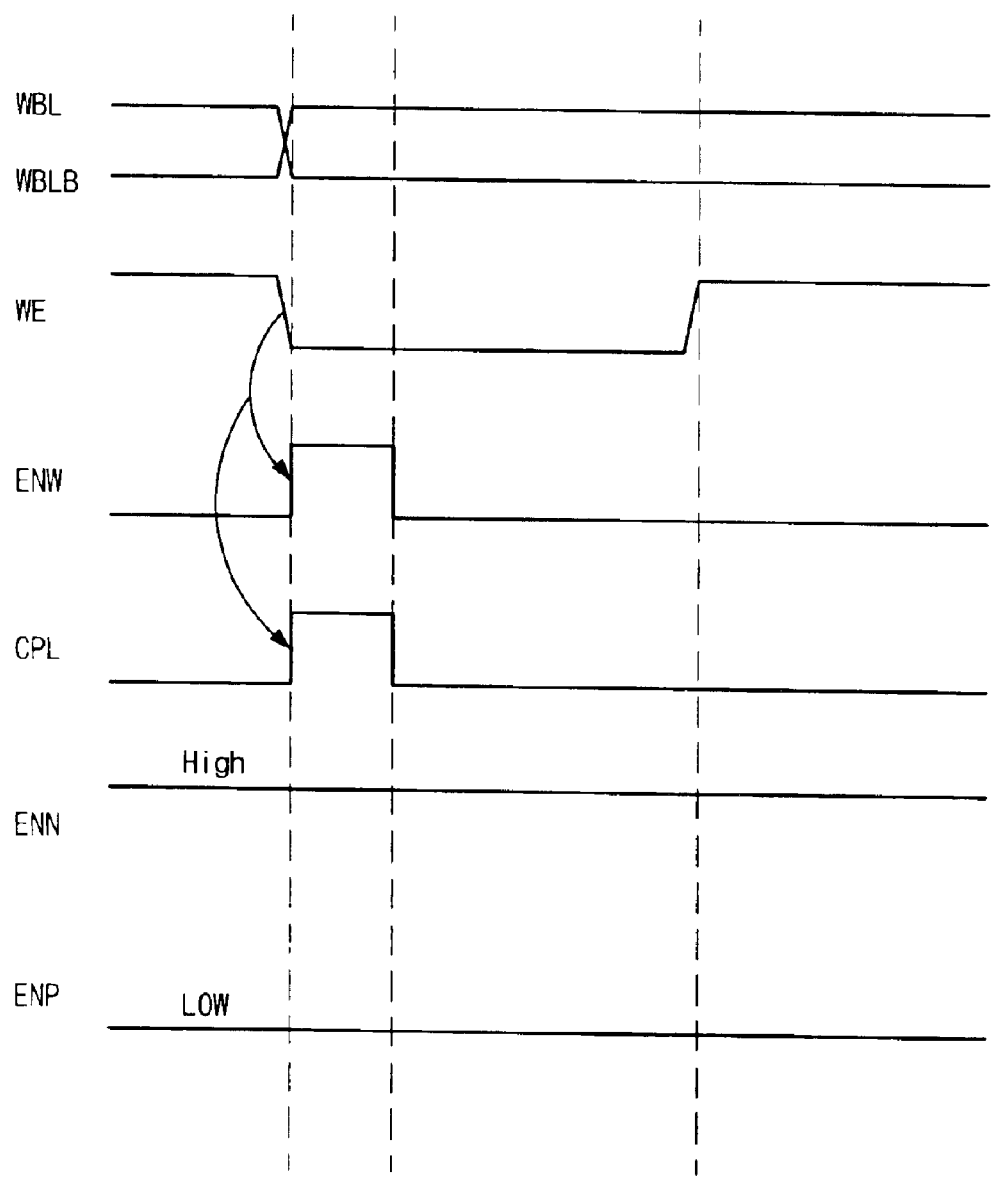
FIG. 13 is a timing diagram illustrating the operation of the nonvolatile ferroelectric memory device of FIG. 1 in a write operation mode.

FIG. 13 is a timing diagram illustrating the operation of the ferroelectric memory device of FIG. 1 in a write operation mode.

First, when a pair of write bitlines WBL and WBLB receives new data, a write enable command signal WE goes to a low level in response to the write enable command signal WE. A write enable signal ENW and a cell plate signal CPL go to a high level. Accordingly, the input data through a pair of bitlines BL and BLB is stored in a memory cell. At this time, a pull-down enable signal ENN maintains a high level and a pull-up enable signal ENP maintains a low level.

Figure 14:
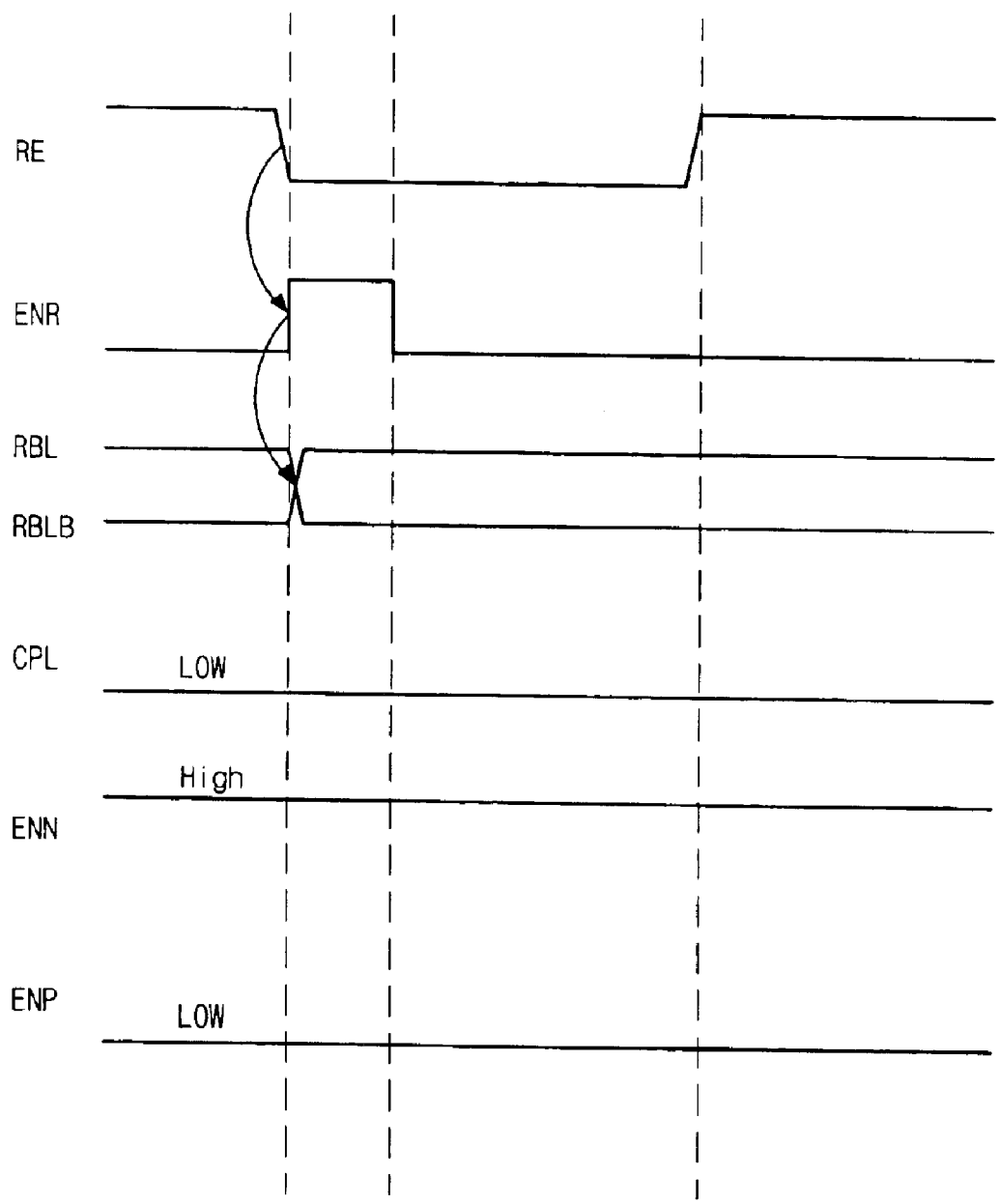
FIG. 14 is a timing diagram illustrating the operation of the nonvolatile ferroelectric memory device of FIG. 1 in a read operation mode.

FIG. 14 is a timing diagram illustrating the operation of the ferroelectric memory device of FIG. 1 in a read operation mode.

First, when a read enable command signal RE goes to a low level, a read enable signal ENR goes to a high level. Sequentially, data stored in the latch unit 73 of the sense amplifier 70 is outputted to a pair of read bitlines RBL and RBLB immediately.

At this time, a cell plate signal CPL and a pull-down enable signal ENN maintain a low level, and a pull-up enable signal ENP maintains a high level.

Accordingly, the nonvolatile ferroelectric memory device according to the present invention directly access cell data stored in the latch unit 73 of the sense amplifier 70 in a read operation mode irrespective of a ferroelectric capacitor of a memory cell, thereby accessing the data rapidly.

As described above, the nonvolatile ferroelectric memory device according to the present invention has various advantages as follows:

First, it precharges read bitlines in a read operation mode, thereby preventing read data fail.

Second, it directly access cell data stored in a latch unit of a sense amplifier in a read operation mode, thereby accessing data rapidly.

Lastly, it restores data stored in a memory cell in response to a special program command in a power-up mode, and thereby overcomes the limit of the number of repeated writing operation due to the destroying operation of a ferroelectric capacitor. As a result, the present invention can obtain a high-speed nonvolatile FeRAM cell having a high reliability.

What is claimed is:

1. A nonvolatile ferroelectric memory device, comprising:
   a memory control block for outputting control signals in response to a write enable command signal, a read enable command signal and a reset signal, wherein the control signals control data read/write operations;
   a ferroelectric memory cell array for writing data and reading data stored in a sense amplifier in response to the control signals, the ferroelectric memory cell array comprising:
      a plurality of bitline pairs;
      a plurality of first single port memory cells connected in a column direction between bitline pairs; and
      the sense amplifier connected between one of the plurality of bitline pairs; and
   a power-up reset circuit for outputting the reset signal to restore data stored in the ferroelectric memory cell array,
   wherein the plurality of first single port memory cells comprise:
      a first latch means for amplifying a high level by using a voltage difference among output nodes;
      a write control means for selectively connecting the plurality of bitlines to output nodes in response to the control signals;
      a storage means including a plurality of ferroelectric capacitors;

a second latch means for amplifying a low level by using the voltage difference among output nodes;

a pull-up switch for selectively applying a power supply voltage to the first latch means in response to the control signals; and a pull-down switch for selectively connecting the second latch means to a ground voltage in response to the control signals.

2. The nonvolatile ferroelectric memory device of claim 1, wherein the first latch means comprises cross-coupled PMOS transistors between the output nodes.

3. The nonvolatile ferroelectric memory device of claim 1, wherein the storage means comprises:

first and second ferroelectric capacitors having one terminal connected to the output nodes respectively and the other terminal commonly receiving the control signals; and third and fourth ferroelectric capacitors having one terminal connected to the output nodes respectively and the other terminal connected to the ground voltage.

4. The nonvolatile ferroelectric memory device of claim 3, wherein a number of the third and fourth ferroelectric capacitors increases according to a loading level of the output nodes.

5. A nonvolatile ferroelectric memory device, comprising:

a memory control block for outputting control signals in response to a write enable command signal, a read enable command signal and a reset signal, wherein the control signals control data read/write operations;

a ferroelectric memory cell array for writing data and reading data stored in a sense amplifier in response to the control signals; and a power-up reset circuit for outputting the reset signal to restore data stored in the ferroelectric memory cell array, wherein the ferroelectric memory cell array comprises:
a plurality of bitline pairs;
a plurality of common pull-up lines;
a plurality of common pull-down lines;
a plurality of pull-up means for selectively applying a power supply voltage to the plurality of common pull-up lines respectively in response to the control signals;
a plurality of pull-down means for selectively connecting the plurality of common pull-down lines with ground voltages respectively in response to the control signals;
a plurality of second single port memory cells connected in a column direction between bitline pairs; and
the sense amplifier connected between one of the plurality of bitline pairs.

6. The nonvolatile ferroelectric memory device of claim 5, wherein the plurality of second single port memory cells comprise:

a first latch means for amplifying a high level by using a voltage difference between output nodes;

a write control means for selectively connecting the plurality of bitlines to output nodes in response the control signals;

a storage means including a plurality of ferroelectric capacitors; and a second latch means for amplifying a low level by using the voltage difference between output nodes.

7. The nonvolatile ferroelectric memory device of claim 6, wherein the first latch means comprises cross-coupled PMOS transistors between the output nodes.

8. The nonvolatile ferroelectric memory device of claim 6, wherein the storage means comprises:

first and second ferroelectric capacitors having one terminal connected to the output nodes respectively and the other terminal commonly receiving the control signals; and third and fourth ferroelectric capacitors having one terminal connected to the output nodes respectively and the other terminal connected to a ground voltage.

9. The nonvolatile ferroelectric memory device of claim 8, wherein a number of the third and fourth ferroelectric capacitors is increased according to a loading level control of the output nodes.

10. A nonvolatile ferroelectric memory device, comprising:

a memory control block for outputting control signals in response to a write enable command signal, a read enable command signal and a reset signal, wherein the control signals control data read/write operations;

a ferroelectric memory cell array for writing the data, and reading data stored in a sense amplifier in response to the control signals; and a power-up reset circuit for outputting the reset signal to restore data stored in the ferroelectric memory cell array, wherein the ferroelectric memory cell array comprises:
a plurality of write bitline pairs;
a plurality of read bitline pairs;
a plurality of first multi port memory cells connected in a column direction between one of the plurality of write bitline pairs and one of the plurality of read bitline pairs;
a write driving means connected between one of the plurality of write bitline pairs; and
the sense amplifier connected between one of the plurality of read bitline pairs.

11. The nonvolatile ferroelectric memory device of claim 10, wherein the plurality of first multi port memory cells comprise:

a first latch means for amplifying a high level by using a voltage difference between output nodes;

a plurality of write control means for selectively connecting the plurality of write bitline pairs to output nodes in response to the control signals;

a storage means including a plurality of ferroelectric capacitors;

a second latch means for amplifying a low level by using the voltage difference between output nodes;

a plurality of read control means for changing a voltage level of the plurality of read bitline pairs in response to the control signals and a potential of the output nodes;

a pull-up switch for selectively applying a power supply voltage to the first latch means in response to the control signals; and a pull-down switch for selectively connecting the second latch means to a ground voltage in response to the control signals.

12. The nonvolatile ferroelectric memory device of claim 11, wherein the first latch means comprises cross-coupled PMOS transistors between the output nodes.

13. The nonvolatile ferroelectric memory device of claim 11, wherein the storage means comprises:

first and second ferroelectric capacitors having one terminal connected to the output nodes respectively and the other terminal commonly receiving the control signals; and third and fourth ferroelectric capacitors having one terminal connected to the output nodes respectively and the other terminal connected to the ground voltage.

14. The nonvolatile ferroelectric memory device of claim 13, wherein a number of the third and fourth ferroelectric capacitors is increased according to a loading level of the output nodes.

15. The nonvolatile ferroelectric memory device of claim 11, wherein the plurality of read control means comprises first and second switch means for selectively connecting the plurality of read bitline pairs to ground voltages in response to the control signals and a potential of the output nodes.

16. The nonvolatile ferroelectric memory device of claim 10, wherein the sense amplifier comprises:
 a pull-up driving means for selectively applying a power supply voltage to the plurality of read bitline pairs according to a voltage difference of the read bitline pairs; and
 a latch means storing data loaded on read bitlines for a predetermined time.

17. The nonvolatile ferroelectric memory device of claim 16, wherein the pull-up driving means comprises:
 a detecting means for detecting the voltage difference of the read bitline pairs; and
 first and second pull-up means for applying the power supply voltage to the plurality of read bitline pairs respectively in response to an output signal from the detecting means.

18. A nonvolatile ferroelectric memory device, comprising:
 a memory control block for outputting control signals in response to a write enable command signal, a read enable command signal and a reset signal, wherein the control signals control data read/write operations;
 a ferroelectric memory cell array for writing the data, and reading data stored in a sense amplifier in response to the control signals; and
 a power-up reset circuit for outputting the reset signal to restore data stored in the ferroelectric memory cell array;
 wherein the ferroelectric memory cell array comprises:
  a plurality of write bitline pairs;
  a plurality of read bitline pairs;
  a plurality of common pull-up lines;
  a plurality of common pull-down lines;
  a plurality of pull-up means for selectively applying a power supply voltage to the plurality of common pull-up lines respectively in response to the control signal;
  a plurality of pull-down means for selectively connecting the plurality of common pull-down lines to ground voltages respectively in response to the control signal;
  a plurality of second multi port memory cells connected in a column direction between one of the plurality of write bitline pairs and one of the plurality of read bitline pairs;
  a write driving means connected between one of the plurality of write bitline pairs; and
  the sense amplifier connected between one of the plurality of read bitline pairs.

19. The nonvolatile ferroelectric memory device of claim 18, wherein the second multi port memory cell comprises:
 a first latch means for amplifying a high level by using a voltage difference between output nodes;
 a plurality of write control means for selectively connecting bitlines with output nodes in response to the control signals;
 a storage means including a plurality of ferroelectric capacitors;
 a second latch means for amplifying a low level by using the voltage difference between output nodes; and
 a plurality of read control means for changing a voltage level of the plurality of read bitline pairs in response to the control signals and a potential of the output nodes.

20. The nonvolatile ferroelectric memory device of claim 19, wherein the latch means comprises PMOS transistors cross-coupled between the output nodes.

21. The nonvolatile ferroelectric memory device of claim 19, wherein the storage means comprises:
 first and second ferroelectric capacitors having one terminal connected to the output nodes respectively and the other terminal commonly receiving the control signals; and
 third and fourth ferroelectric capacitors having one terminal connected to the output nodes respectively and the other terminal connected to a ground voltage.

22. The nonvolatile ferroelectric memory device of claim 20, wherein a number of the third and fourth ferroelectric capacitors increases according to a loading level of the output nodes.

23. The nonvolatile ferroelectric memory device of claim 18, wherein the sense amplifier comprises:
 a pull-up driving means for selectively applying a power supply voltage to the plurality of read bitline pairs according to a voltage difference of the plurality of read bitline pairs; and
 a latch means for storing data loaded on read bitlines for a predetermined time.

24. The nonvolatile ferroelectric memory device of claim 23, wherein the pull-up driving means comprises:
 a detecting means for detecting the voltage difference of the plurality of read bitline pairs; and
 first and second pull-up means for applying the power supply voltage to the plurality of read bitline pairs respectively in response to an output signal from the detecting means.

* * * * *